United States Patent [19]

Gimmler

[11] Patent Number: 4,881,174

[45] Date of Patent: Nov. 14, 1989

[54] SINUSOIDAL SIGNAL FREQUENCY MEASURING DEVICE

[75] Inventor: Helmut Gimmler, Waiblingen, Fed. Rep. of Germany

[73] Assignee: Daimler-Benz AG, Fed. Rep. of Germany

[21] Appl. No.: 215,471

[22] Filed: Jul. 5, 1988

[30] Foreign Application Priority Data

Jul. 2, 1987 [DE] Fed. Rep. of Germany ....... 3721827

[51] Int. Cl.$^4$ ............................................. G01R 23/02
[52] U.S. Cl. .................................... 364/484; 324/83 D
[58] Field of Search ...................... 364/484; 324/83 D

[56] References Cited

U.S. PATENT DOCUMENTS 4,363,099 12/1982 Srinivasan et al. ................. 364/484

FOREIGN PATENT DOCUMENTS 3125197 4/1982 Fed. Rep. of Germany .

Primary Examiner—Emanuel S. Kemeny
Attorney, Agent, or Firm—Barnes & Thornburg

[57] ABSTRACT

A device for high resolution measurement of frequency of a sinusoidal signal generated by a signal generator using an analog to digital converter to digitize the signal at an adjustable sampling frequency for a period defined by a given zero transition. The frequency is proportional to the number of samples taken within the measured period adjusted by a mathematical relationship between the absolute values of the sampled signal before and after the zero transition.

11 Claims, 6 Drawing Sheets

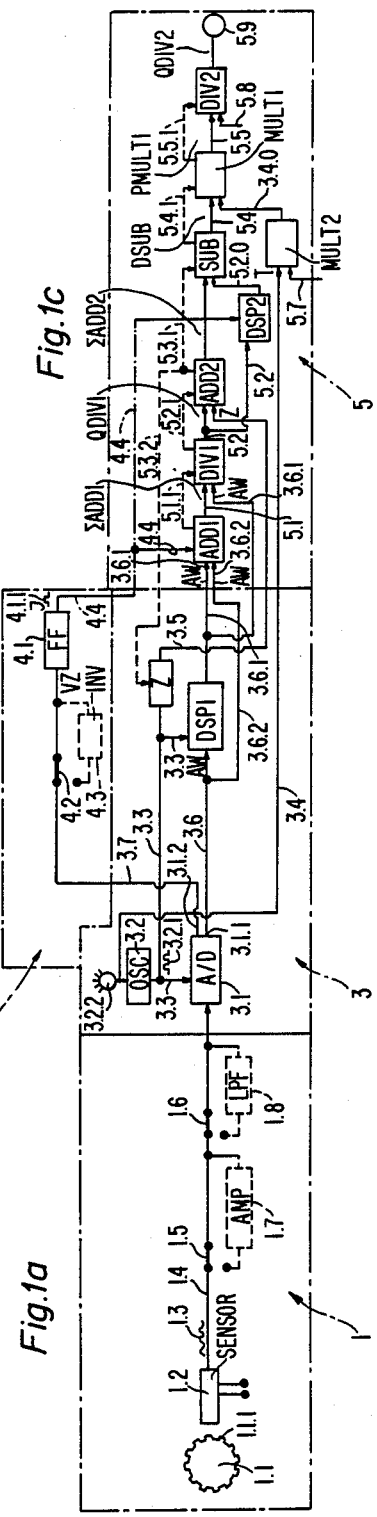

SINUSOIDAL SIGNAL FREQUENCY MEASURING DEVICE

BACKGROUND AND SUMMARY OF THE INVENTION

The present invention relates generally to sinusoidal signal frequency measuring devices and more specifically to digitized sinusoidal signal frequency devices using zero transitions.

Sinusoidal signal frequency measuring devices are generally known in which either the periods of the sinusoidal signal generated are counted within a particular gate time or clock pulses are counted during the periods of the signal generated and are correspondingly evaluated in a signal processing unit for obtaining information on the frequency/rotational speed. An example of such a device is shown in German Patent Specification No. 31 25 197.

In addition, a generic device is known, for example, U.S. Pat. No. 4,363,099, wherein the frequency of a sinusoidal signal, particularly a deviation from the known and largely constant frequency, can be determined without requiring a zero transition determination In this arrangement, a large number of measurements is performed per period of the sinusoidal signal for forming digital valves which are stored and from which the frequency is then determined by linear interpolation and formula relations.

It is the object of the invention to develop a generic device for a high-resolution determination of an unknown frequency or rotational speed of a shaft with the least measurement expenditure.

This and other objects of the invention are achieved by providing a signal processing unit connected to a signal generating unit wherein the signal processing unit includes a signal sampling unit, a comparator or period unit and an evaluation unit. The signal sampling unit includes an adjustable sampling clock frequency oscillator which is set to oscillate at a higher frequency than the expected frequency of the sinusoidal signal, an analog to digital (A/D) converter for sampling, at the sampling clock frequency, the sinusoidal signal generated by the signal generator to provide a digitized value as a sign output and as an absolute valve output. A first digital memory is triggered by sampling clock pulse for storing the absolute value formed during the preceding cycle. A counter is also provided to count sampling clock pulses until reset. The comparator or period unit includes a flip-flop triggered by a transition of the sign output signal from the analog to digital converter from a first to a second sign for providing a transition output pulse J.

The evaluation unit includes a plurality of arithmetic elements operated in sequence. A first adder, triggered by the transition output signal J, adds the previous absolute value from the first digital memory with the present absolute value from the A/D converter. A first divider performs a quotient of the sum from the first adder and the previous absolute value from the first digital memory. A second adder adds the output of the first divider with the present count in the counter, which represents the count of the period, and generates a reset signal to reset the counter. A subtractor subtracts the sum output of the second adder from a previous quotient of the first divider which it receives from a second digital memory which is triggered by the transition output pulse J to store the previous quotient from the first divider. A first multiplier multiplies the difference output of the subtractor by a signal-generator-specific product to produce a frequency output signal.

The signal-generator-specific product may be provided to the first multiplier manually as the product of the sampling time T of the sampling frequency set for the oscillator times the number of uniform divisions of the transmitter of the signal generator or may be calculated by a second multiplier which receives the sampling period T of the sampling frequency from the isolator and multiplies it times a manually inputted number of divisions of the transmitter of the signal generator. A second divider may be provided on the output of the first multiplier to divide the output by 60 so as to convert the output signal from revolutions per second to revolutions per minute. Once the first adder is activated by the transition output pulse J, the remainder of the arithmatic devices are activated upon receiving a completion signal from the previous element or stage.

Thus, for example, conclusions with respect to the condition of an internal combustion engine, can be drawn from the high-resolution rotational speed information by suitable analysis. For example, information on the torque can be obtained from the changes in rotational speed during one or more operating cycles, even in non-steady-state operation. By combining these information items with other signals sampled at the same time, conclusions can be drawn with respect to error sources, for example in the workshop area or in production control. Since in addition, analogous measurement values are registered during the other measurement value recordings taken on the engine and on the vehicle, this device can be advantageously integrated into the existing recording systems.

Other objects, advantages and novel features of the present invention will become apparent from the following detailed description of the invention when considered in conjunction with the accompanying drawings.

BRIEF DESCRIPTION OF THE DRAWINGS

FIGS. 1 and 1a–1c show a block diagram of a measuring device according to the principles of the present invention.

DETAILED DESCRIPTION OF THE DRAWINGS

Figure 1A:
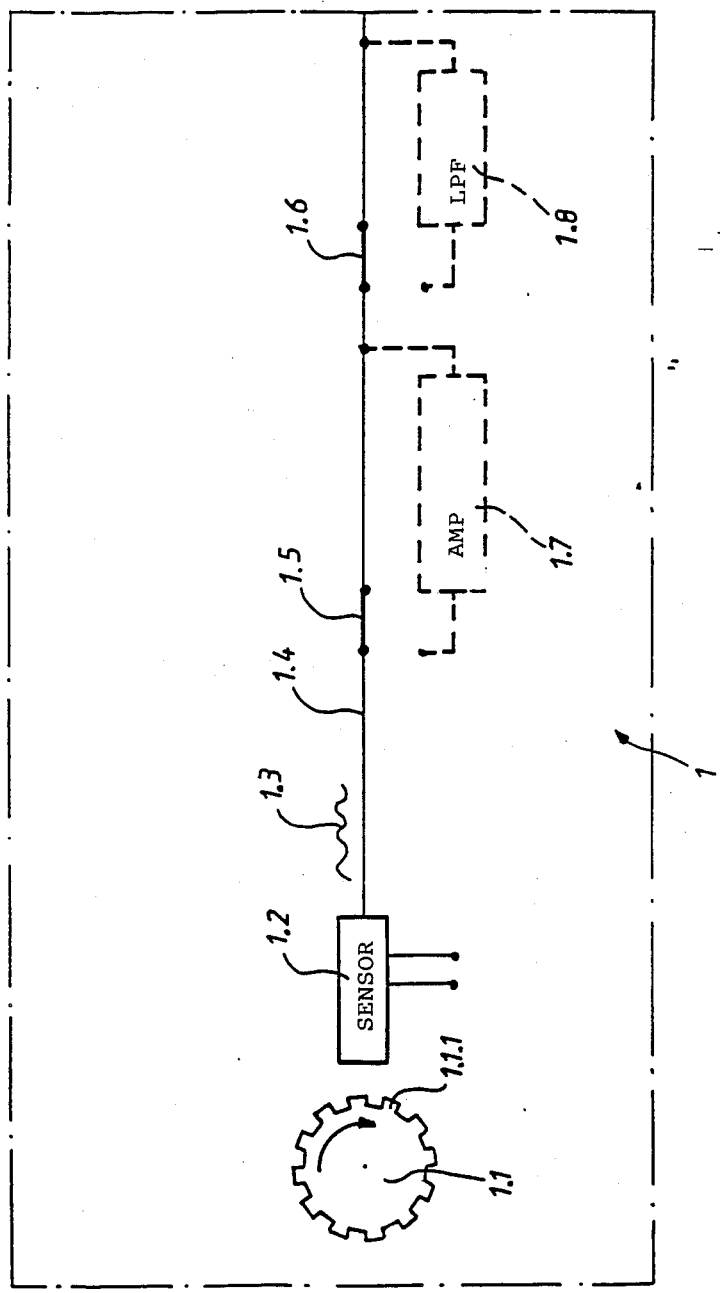

The measuring device essentially comprises four units: a signal generator unit 1 and a signal processing unit 2 consisting of a signal sampling unit 3, a comparator or period unit 4 and an evaluating unit 5.

The signal generator unit 1 comprises a transmitter 1.1 which is connected to a shaft, the rotational speed of which must be measured, which is provided with uniform divisions 1.1.1 and which are formed as teeth or light/dark markings. The transmitter 1.1 itself can be formed, for example, by the starter gear ring on the fly wheel of an engine. A sensor 1.2, which is constructed as inductive, capacitive or optical sensor, is arranged adjacently to the divisions 1.1.1 of the transmitter 1.1. The sinusoidal signal 1.3 generated by the sensor, when the transmitter is rotating, is supplied via a line 1.4 to an analog to digital (A/D) converter 3.1 of the signal sampling unit 3. An amplifying and/or offset section 1.7 and a low-pass filter 1.8 can be looped into the line 1.4 via switches 1.5 and 1.6. While the amplifying and/or offset section 1.7 has the effect of optimally matching the sinusoidal signal to the acceptance range of the A/D converter 3.1, the low-pass filter 1.8 eliminates high-frequency interference in the sinusoidal signal while the useful frequency can pass unimpeded.

In addition to the A/D converter 3.1, the signal sampling unit 3 contains an oscillator 3.2 for generating a sampling clock frequency 3.2.1, the sampling period of which can be set via a corresponding adjusting section 3.2.2, and a counter Z and a digital memory DSP 1. The oscillator 3.2 is connected to the A/D converter 3.1, the counter Z and the digital memory DSP 1 via clock line 3.3. The sampling period T (sec.) set at the adjusting section 3.2.2 is transferred via a line 3.4 to a multiplier MULT 2. The respective count $Z_z$ is transferred via a line 3.5 to an adder ADD 2 of the evaluating unit 5. One output 3.1.1 of the A/D converter 3.1 is connected via a line 3.6 to the digital memory DSP 1 and via line 3.6.2 to an adder ADD 1 of the evaluation unit 5. The output of digital memory DSP 1 is connected via a line 3.6.1 to both the adder ADD 1 and a divider DIV 1 of the evaluating unit. The other output 3.1.2 of the A/D converter 3.1 is connected via a sign line 3.7 to an edge-controlled monostable flip-flop stage 4.1, for example TTL 74 121, of the comparator unit 4, in which arrangement an inverter 4.3 can be looped into the sign line 3.7 via a change-over switch 4.2.

Within the evaluating unit 5, the adder ADD 1 is connected both via a signal line 5.1 and via a command line 5.1.1 to the divider DIV 1, which is connected via a signal line 5.2 and command line 5.2.1 to the adder ADD 2. The adder ADD 2 is connected via a signal line 5.3 and a Command line 5.3.1 to a subtracting unit SUB which is connected via a signal line 5.4 and a command line 5.4.1 to a multiplier MULT 1. The multiplier MULT 1 is connected via a signal line 5.5 and a command line 5.5.1 to a divider DIV 2. Another digital memory DSP 2 has an input connected to the divider DIV 1 via the signal line 5.2 and an output connected to the subtracting unit SUB via a signal line 5.2.0. The adder ADD 2 is also connected to the counter Z of the signal sampling unit 3 via a command line 5.3.2 and the multiplier MULT 2 is also connected to the multiplier MULT 1 via a signal line 3.4.1. The "number of transmitter divisions 1.1.1" is inputted to the multiplier MULT 2 via the input line 5.7 and the dividend "60" is inputted to the divider DIV 2 via the input line 5.8.

Furthermore, the flip-flop stage 4.1 is connected via a Pulse line 4.4 both to the adder ADD 1 and to the digital memory DSP 2 for transmitting an output pulse 4.1.1 generated by it.

Figure 1B:
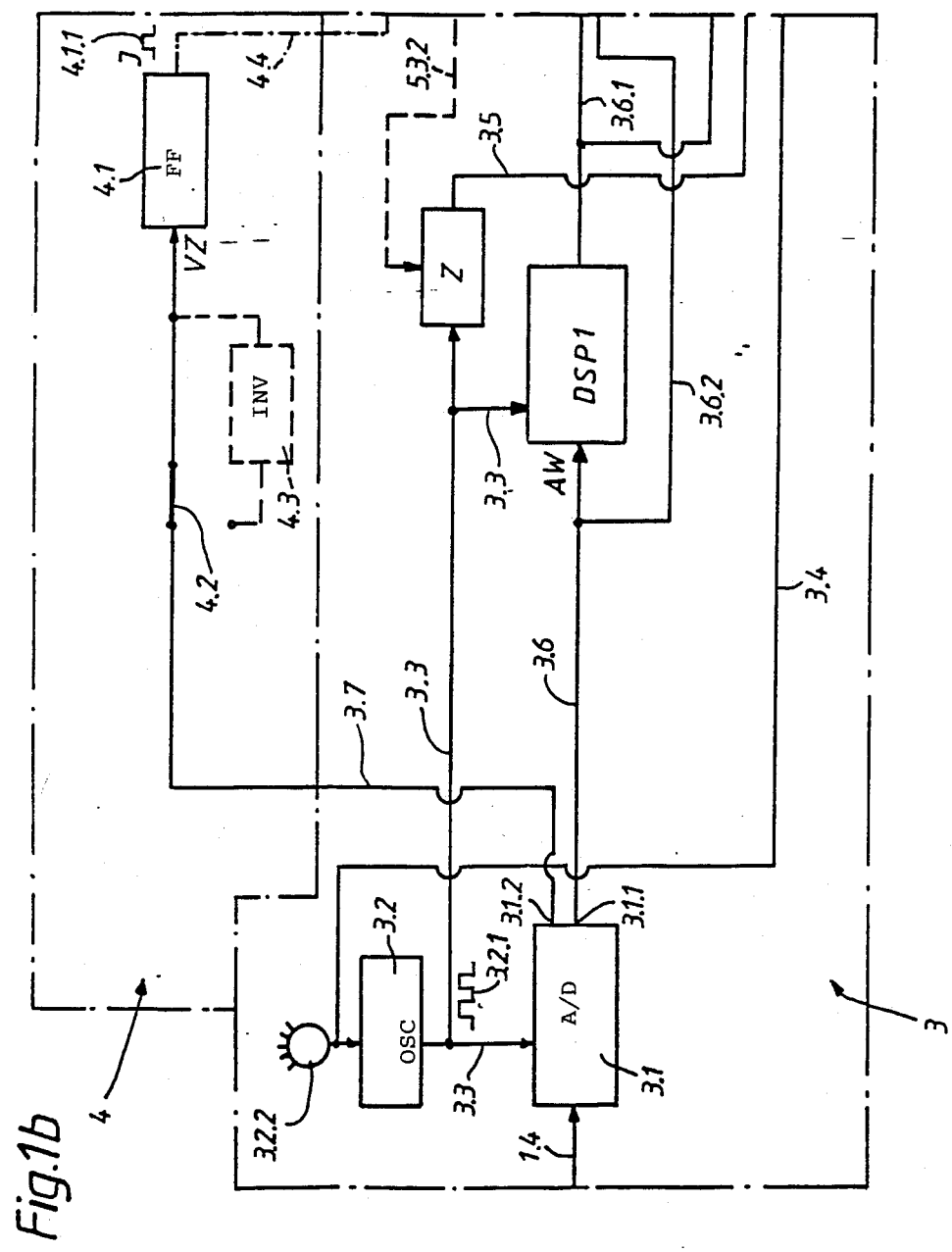
Figure 1C:
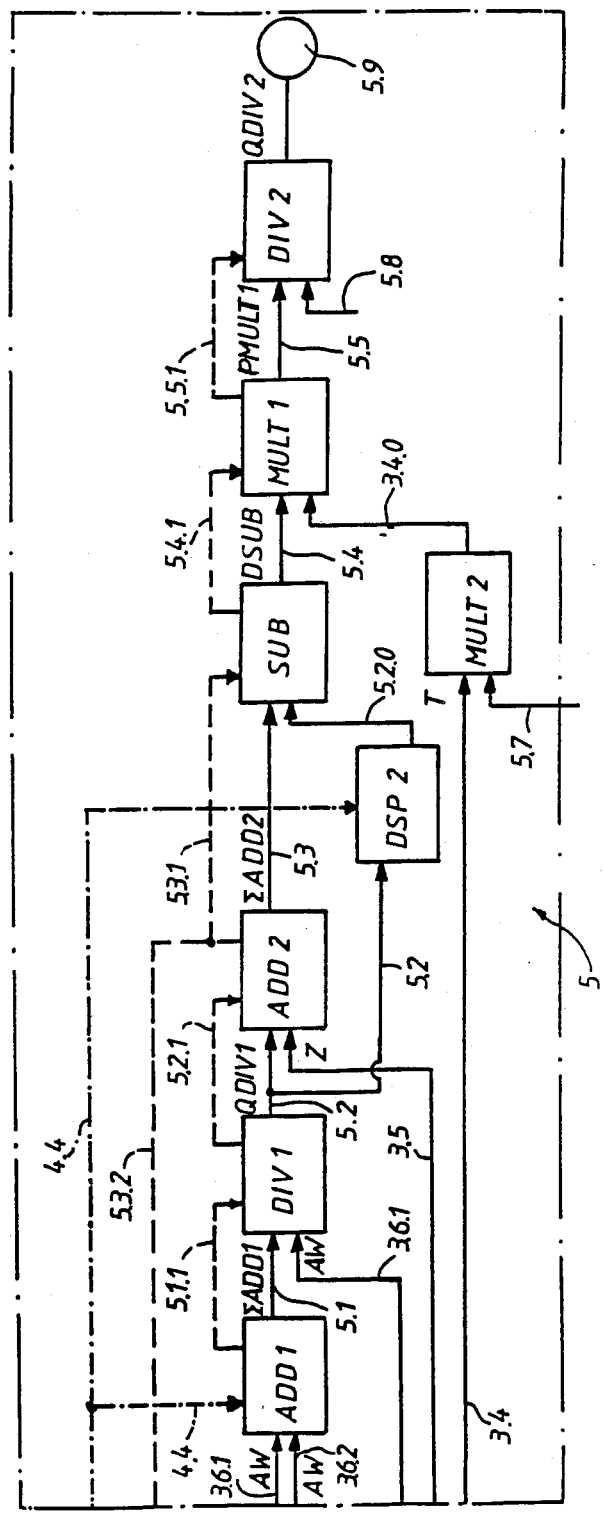
Figure 2:
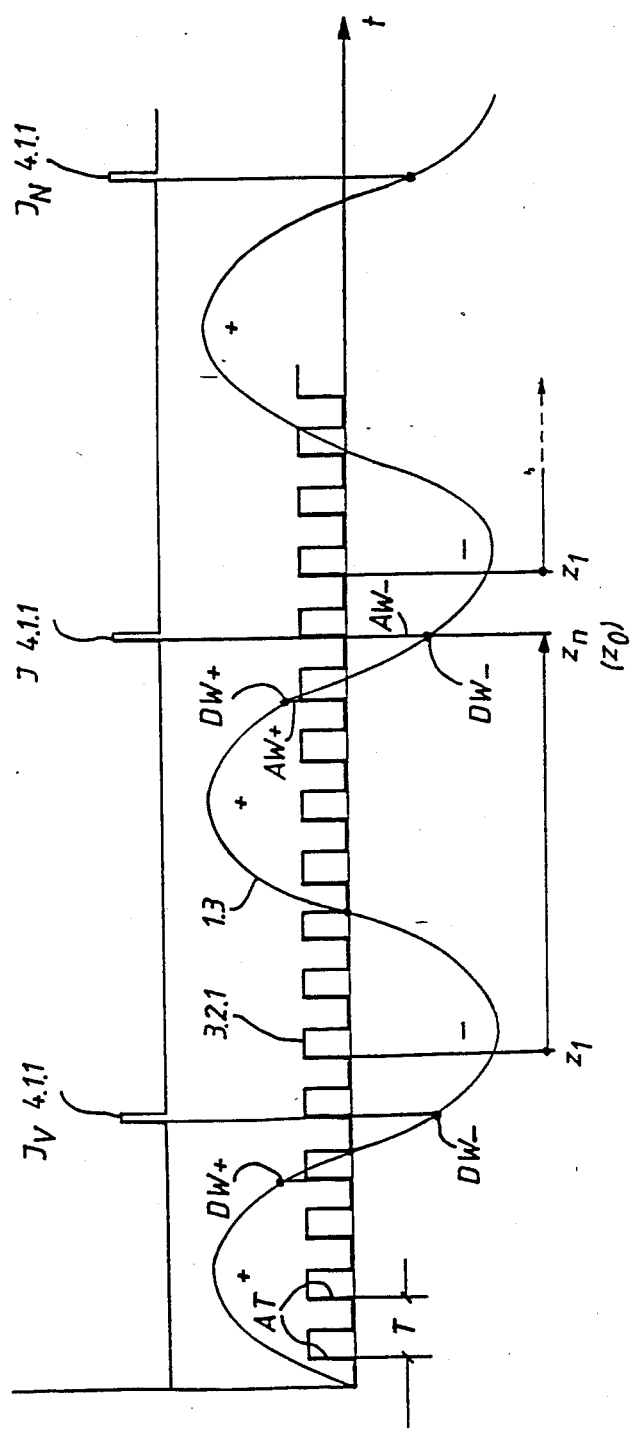
FIG. 2 shows a timing chart of the signals and pulses.

The device operates as follows and is explained in greater detail with reference to FIGS. 1 and 2.

Due to the transmitter 1 with its divisions 1.1.1, which rotates with the shaft, a sinusoidal signal 1.3 is generated in the sensor 1.2 which is supplied to the A/D converter 3.1. The A/D converter 3.1 is activated by the oscillator 3.2 via the clock line 3.3 with a constant sampling clock frequency 3.2.1 which is a multiple, at least twice, the signal frequency of the signal 1.3 and is correspondingly predetermined at the adjusting section 3.2.2 in dependence on the rotational speed of the shaft. With each sampling clock pulse, the A/D converter 3.1 forms from the sinusoidal signal 1.3, a digital value DW associated with the sampling clock pulse and applies this value to output 3.1.1 as an absolute value AW and to output 3.1.2 as a sign VZ. The sinusoidal analog signal 1.3 is thus correspondingly digitized, the digital value being represented as conversion result, for example in 2's complement code (where the value "+1" is output at 0001, the value "−1" as 1111, the value "+2" as 0010, the value "−2" as 1110, and so forth, the first digit containing the sign).

Let it be assumed then, that the last positive digital value DW+, and thus its absolute value AW+ and its sign VZ+, have been formed in the A/D converter 3.1 by a sampling clock pulse from the positive half wave of the sinusoidal signal and have been applied to the outputs 3.1.1 and 3.1.2. Thus, the sign VZ+ is also present, via the sign line 3.7 and the change-over switch 4.2, which is closed in this line, at flip-flop stage 4.1 and the absolute value AW+ is also present both at the digital memory DSP 1 via line 3.6 and at the adder ADD 1 via line 3.6.2.

During the next sampling clock pulse, the digital memory DSP 1 is activated via the clock line 3.3, which memory then accepts the absolute value AW+ present at its input, and the count of the counter Z is incremented by "1".

Furthermore, the A/D converter 3.1 is activated via the clock line 3.3, which converter then forms the first negative digital value DW−, and thus its absolute value AW− and its sign VZ−, from the first negative half wave of the sinusoidal signal. The negative sign VZ− at the output 3.1.2 is applied, via the sign line 3.7, to the flip-flop 4.1 whereupon the flip-flop 4.1 switches due to the change of sign from "+" to "−". This generates an output pulse J 4.1.1 which activates both the adder ADD 1 and the digital memory DSP 2 via the pulse lines 4.4. The absolute value AW− at the output 3.1.1 is applied both to the digital memory DSP 1 via line 3.6 and to the adder ADD 1 via line 3.6.2. As the adder ADD 1 is activated by the output pulse J, the adder ADD 1 accepts both the stored absolute value AW+ from the digital memory DSP 1 and the absolute value AW− present via the line 3.6.2 and adds them together. Adder ADD 1 activates via command line 5.1.1, the divider DIV 1 which then accepts the result ΣADD 1 of the adder ADD 1, via the signal line 5.1, and the stored absolute value AW+, via the line 3.6.1, and forms the quotient of the absolute value AW+ and the result ΣADD 1. After completion of the arithmetic operation, the divider DIV 1 activates, via the command line 5.2.1, the adder ADD 2 which accepts the result QDIV 1 of the divider DIV 1, via the signal line 5.2, and the count Zn of the counter Z, via the line 3.5, and adds these two values.

In this context, the count Zn corresponds to the number of sampling clock pulses which were generated between the preceding output pulse Jv and the present output pulse J. After completion of the arithmetic operation, the count of the counter Z is reset back to "0" by the adder ADD 2 via the line 5.3.2 and the subtracting unit SUB is activated by adder ADD 2 via the command line 5.3.1. The subtractor SUB then accepts the result ΣADD 2 from the adder ADD 2 via signal line 5.3, 15 and the content QDIV $1_v$ of the digital memory DSP 2 via line 5.2.0, and forms the difference DSUB. In this arrangement, the result QDIV $1_v$ was obtained during the arithmetic operations triggered by the preceding output pulse Jv and transferred it to the digital memory SDP 2 during the present output pulse J by activating the memory DSP 2 via the pulse line 4.4 while the currently present result QDIV 1 is only transferred into the digital memory DSP 2 with the next following output pulse $J_N$.

After completion of the arithmetic operation, the subtracting unit SUB activates, via the command line 5.4.1, the multiplier MULT 1, which forms the product from the result DSUB, present via the signal line 5.4, and the result of the multiplier MULT 2, present via the input line 3.4.0. The result of the multiplier MULT 2 is the product of the sampling period T of the sampling clock frequency 3.2.1, which is present at the multiplier MULT 2 via the line 3.4, and the number of transmitter divisions 1.1.1 (=number of teeth or markings), which is input to the multiplier MULT 2 via the input line 5.7. This results in a signal-generator-specific product since it takes into consideration the individual-case-dependent construction of the transmitter 1.1, which for example, could also execute a translatorial movement. Since both the sampling period T, which is set at 3.2.2, and the number of transmitter divisions 1.1.1 are known, the product could also be manually formed from these and inputted as amount to the multiplier MULT 1 directly, and thus, the multiplier MULT 2 could then be omitted.

After completion of the arithmetic operation, the multiplier MULT 1 activates, via the command line 5.5.1, the divider DIV 2, which then forms the quotient QDIV 2 from the value "60" present via the input line 5.8 and the PMULT 1 result present via the signal line 5.5 from the multiplier MULT 1. The input value "60" to divider DIV 2 converts the result PMULT 1, which is in "seconds per revolution", into the result QDIV 2 in "revolutions per minute" to be displayed on a corresponding component 5.9.

It can be seen that the amplitude values of the signal 1.3 are examined for zero transitions with a falling edge, as a result of which zero point errors are largely compensated during the analog to digital conversion. While in the illustrative embodiment, an output pulse J is always generated, and thus an arithmetic operation run is initiated in the evaluating unit 5, whenever the sinusoidal signal changes from the positive to the negative half wave (falling edge), the amplitude values of the signal 1.3 can be examined for zero transitions with a rising edge, transition from the negative to the positive half wave. This is achieved when the sign signal supplied to the flip-flop stage 4.1 via the sign line 3.7 is alternatively conducted via the inverter 4.3 by switching the changeover switch 4.2 over.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. Device for measuring the frequency of a sinusoidal signal generated by a signal generator, said signal generator including a transmitter revolving with a shaft and having uniform divisions and a sensor, said device comprising:

oscillator means having a constant, but adjustable, sampling clock frequency higher than expected frequency of a sinusoidal signal;

analog to digital converter means, connected to said oscillator means, for receiving sinusoidal signals from said signal generator, sampling at a frequency determined by said sampling clock pulses and providing digital valves as a sign output and an absolute value output;

first digital memory means, connected to said oscillator means and analog to digital converter means, triggered by each sampling clock pulse from said oscillator means, for storing an absolute value formed during the preceding sampling clock pulse by said analog to digital converter means while said analog to digital converter means is providing a next digital value;

counter means, connected to said oscillator means, for counting sampling clock pulses until reset;

flip-flop means, connected to said analog to digital converter means, and triggered by a transition of said sign output from a first to a second sign, for providing a transition output pulse;

first adder means, connected to said first digital memory means, said analog to digital converter means and said flip-flop means, for adding the absolute value of the digital value of said second sign, which triggered said flip-flop means, from said analog to digital converter means to the presently absolute digital value of said first sign from said first digital memory means and providing a first sum output signal in response to said transition output pulse;

first divider means, connected to said first adder means, and said first digital storage means, for forming the quotient of the absolute digital value of said first sign from said first digital memory means and the first sum output signal and providing a first quotient signal in response to a first adder completion signal;

second adder means, connected to said first divider means and said counter means, for adding the present count and the first quotient signal and providing a reset signal to said counter means and a second sum output signal in response to a first quotient completion signal;

second digital storage means, connected to first divider means and said flip-flop means and triggered by said transition output pulse, for storing a first quotient signal, formed in response to a previous transition output pulse while said first divider is forming a present quotient;

subtractor means connected to second adder means and said second digital storage means for forming the difference of the second sum output signal from said second adder means and said first quotient signal of a previous transition output signal from said second digital storage means and providing a different output signal in response to said reset signal; and first multiplier means, connected to said subtractor means and having a signal-generator-specific product input, for forming product of said difference output signal and a signal-generator specific-product signal and providing a frequency output signal for a period between transition output pulses in response to a subtraction completion signal.

2. A device according to claim 1, wherein the sampling clock frequency of said oscillator means is an adjustable multiple of the expected frequency of the sinusoidal signal.

3. A device according to claim 2, wherein at high rotational speed and in consequence high signal frequency, a high sampling clock frequency is set.

4. A device according to claim 1, wherein said digital converter means provides digital values in 2's complement code.

5. A device according to claim 1, wherein said flip-flop means includes an edge-controlled, monostable flip-flop.

6. A device according to claim 5, including an inverter connectable in series with the flip-flop via change-over switch whereby said flip-flop can be triggered by a second to first sign transition.

7. A device according to claim 1, including an amplifier connectable between the sensor and the analog to digital converter via a switch.

8. A device according to claim 1, including a low-pass filter connectable between the sensor and the analog to digital converter via a switch.

9. A device according to claim 1, including manual input means for manually inputting the signal-generator-specific product signal to said first multiplier means.

10. A device according to claim 1, including a second multiplier means for multiplying a sampling period signal of the constant, but adjustable, sampling clock frequency from said oscillator means and number of uniform divisions of said transmitter manually inputted and providing on an output, said signal-generator-specific product to said first multiplier means.

11. A device according to claim 10, including a second divider means for dividing said frequency output signal of said first multiplier means by 60 and providing an output signal in response to a first multiplication completion signal.

* * * * *